United States Patent [19]

Ozawa et al.

[11] Patent Number: 5,306,139
[45] Date of Patent: Apr. 26, 1994

[54] SUCTION ADHESION-TYPE HOLDER

[75] Inventors: Kanji Ozawa; Yukitaka Sonoda, both of Tokyo, Japan

[73] Assignee: Kabushiki Kaisha Shinkawa, Tokyo, Japan

[21] Appl. No.: 792,708

[22] Filed: Nov. 15, 1991

[30] Foreign Application Priority Data

Nov. 16, 1990 [JP] Japan ................... 2-308717

[51] Int. Cl.[5] ............................................ F27D 5/00
[52] U.S. Cl. ................................. 432/225; 432/253; 168/900
[58] Field of Search ............... 432/225, 205, 220, 227, 432/253; 156/583.1; 165/900, 122

[56] References Cited

U.S. PATENT DOCUMENTS

| | | | |
|---|---|---|---|
| 4,483,392 | 11/1984 | Korsmo et al. | 165/900 |
| 4,513,813 | 4/1985 | Zanobini | 165/900 |
| 4,657,070 | 4/1987 | Kluppel | 165/900 |
| 4,721,462 | 1/1988 | Collins, Jr. | 432/253 |
| 4,867,231 | 9/1989 | Bottum | 165/122 |
| 4,872,835 | 10/1989 | Tullis et al. | 432/225 |
| 4,874,035 | 10/1989 | Kashiwada et al. | 165/900 |

FOREIGN PATENT DOCUMENTS 57-49388  10/1982  Japan ...................... 21/60

*Primary Examiner*—Henry C. Yuen
*Attorney, Agent, or Firm*—Koda and Androlia

[57] ABSTRACT

A suction adhesion-type holder used, for example, in a bonding machine including an air cooling device provided between a bonding stage and a vacuum pump that creates a vacuum suction in the bonding stage through the cooling device. Air suction holes formed in the bonding stage, that has a heating element, are connected to the air cooling device via a pipe and air heated by the bonding stage is cooled in the air cooling device when the heated air flows in a spiral pipe installed inside the cooling device and then sucked into the vacuum pump. The spiral pipe is cooled by a fan.

1 Claim, 3 Drawing Sheets

SUCTION ADHESION-TYPE HOLDER

BACKGROUND OF THE INVENTION

1. Field of the Invention

The present invention relates to a suction adhesion-type holder which holds workpieces on a stage, that has a heating means, by way of vacuum suction adhesion.

2. Prior Art

In bonding machines, for example, workpieces such as substrates and lead frames, etc. are placed on a bonding stage that is provided with a heating element. With keeping the workpieces in position on the bonding stage by vacuum suction adhesion, wire bonding, chip bonding, etc. are performed. A bonding machine of this type is described in Japanese Utility Model Application Publication (Kokoku) No. 57-49388.

In this prior art, since the air surrounding the bonding stage is heated by the bonding stage and is sucked into the vacuum pump, the pump tends to be damaged. Accordingly, the piping system used in the bonding machine must be heat-resistant, which is generally expensive.

SUMMARY OF THE INVENTION

Accordingly, the object of the present invention is to provide a suction adhesion-type holder for workpieces such as semiconductor devices, etc. which can prevent damage to the vacuum pump.

In order to accomplish the object, the present invention is of a unique structure wherein an air cooling device is employed at an intermediate point in the piping system that connects the vacuum pump to the bonding stage.

Since the air heated by the bonding stage is cooled by the air cooling device before it enters the vacuum pump, damage to the vacuum pump is prevented. As a result, for the pipe which is between the vacuum pump and the air cooling device, pipes that can be generally used at room temperatures are used.

DETAILED DESCRIPTION OF THE INVENTION

Figure 1:
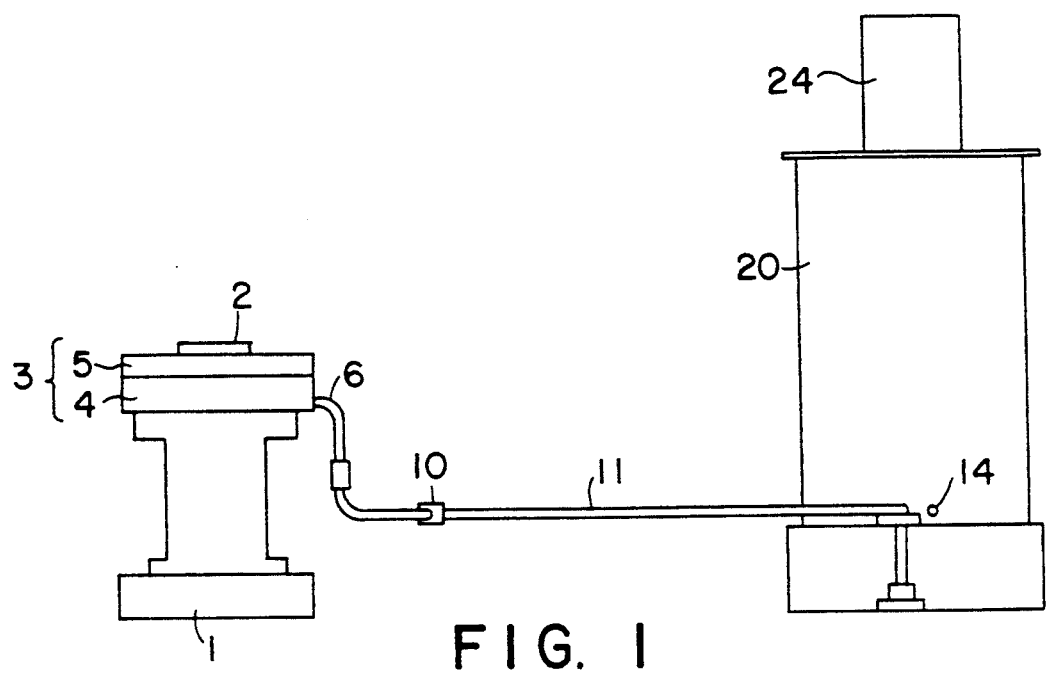
FIG. 1 is a front view of the suction adhesion-type holder according to one embodiment of the present invention.
Figure 2:
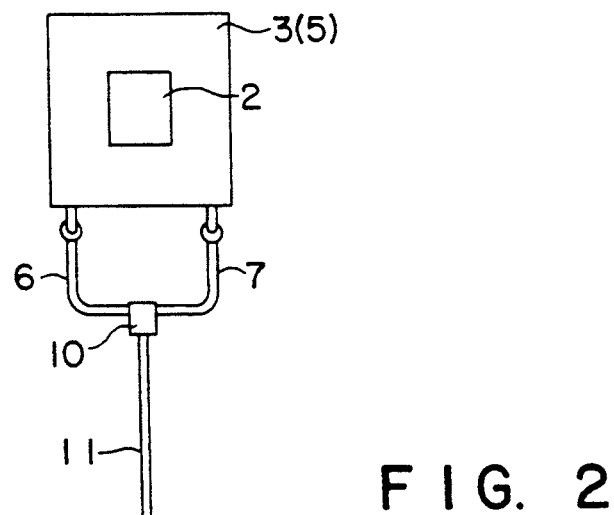
FIG. 2 is a top view thereof.
Figure 2:
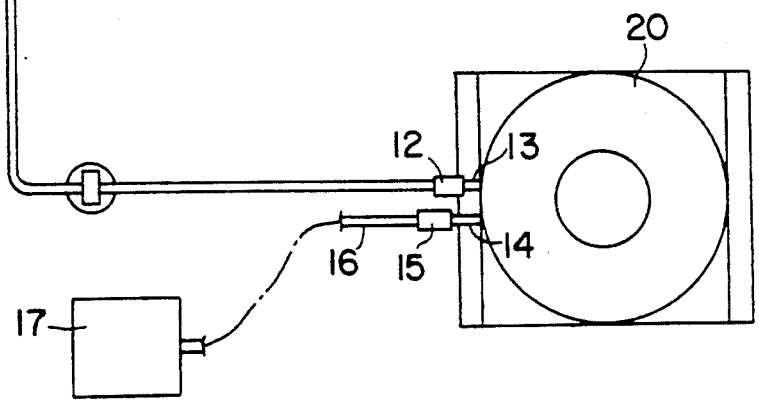

One embodiment of the present invention will be described below with reference to FIGS. 1 through 4:

As shown in FIGS. 1 and 2, bonding stage 3 which holds workpiece 2 is provided on a base 1. The bonding stage 3 consists of heating block 4 which contains heater (not shown) and hot plate 5 which carries the workpiece 2.

A suction adhesion hole (or holes), that is not shown in the drawing, is formed in the stage 3. The suction adhesion hole, which is used to hold the workpiece 2 in place by vacuum suction adhesion, is connected to pipes 6 and 7. Since the structure of suction adhesion is of a universally known type, further description is omitted.

Pipes 6 and 7 are connected to a central pipe 11 via joint 10, and the central pipe 11 is connected to an intake pipe 13 of air cooling device 20 via joint 12. Outlet pipe 14 of the air cooling device 20 is connected to pipe 16 via a joint 15, and the pipe 16 is connected to a vacuum pump 17.

Figure 3:
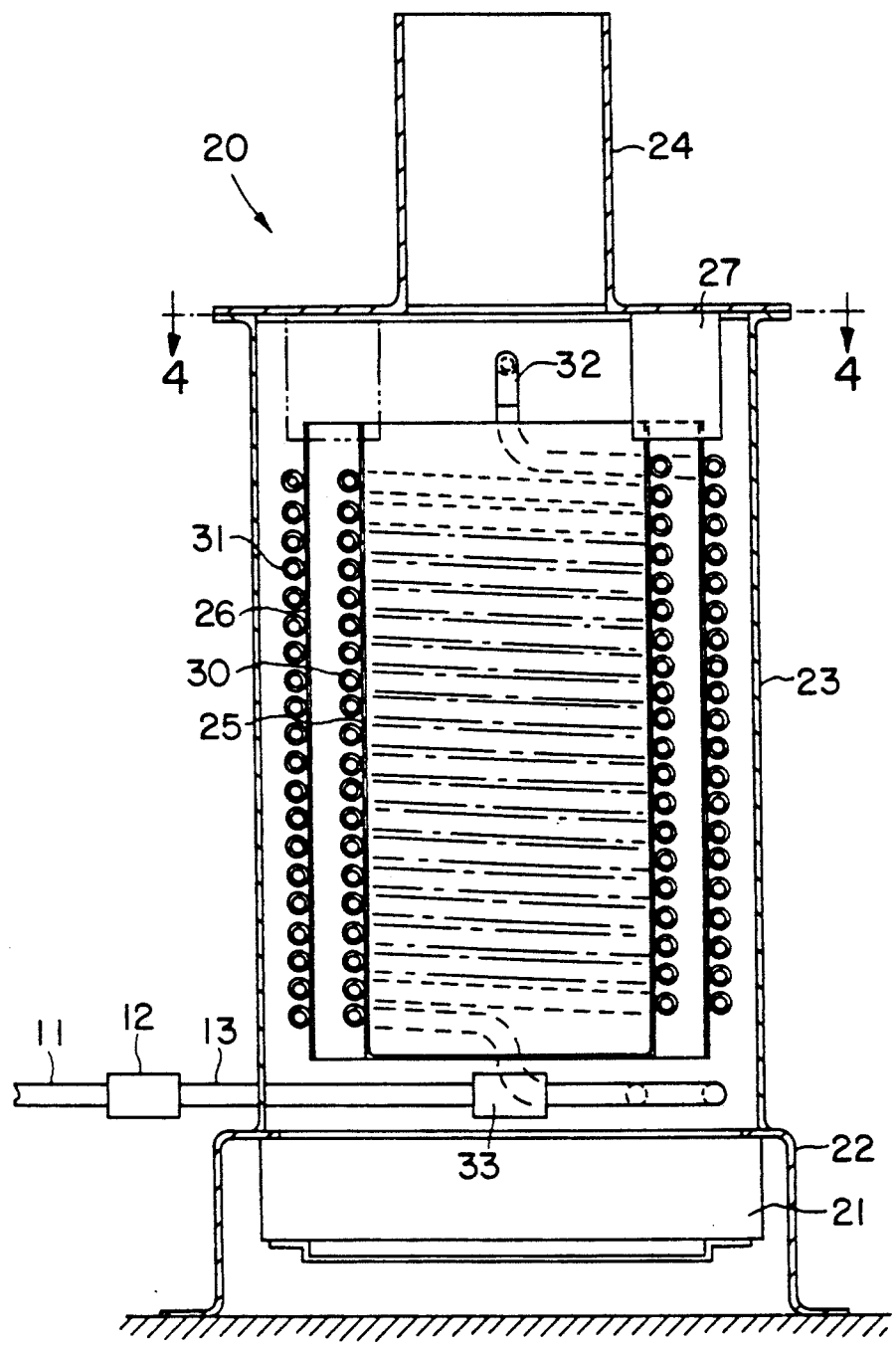
FIG. 3 is a vertical cross section of the air cooling device used in the holder of the present invention.
Figure 4:
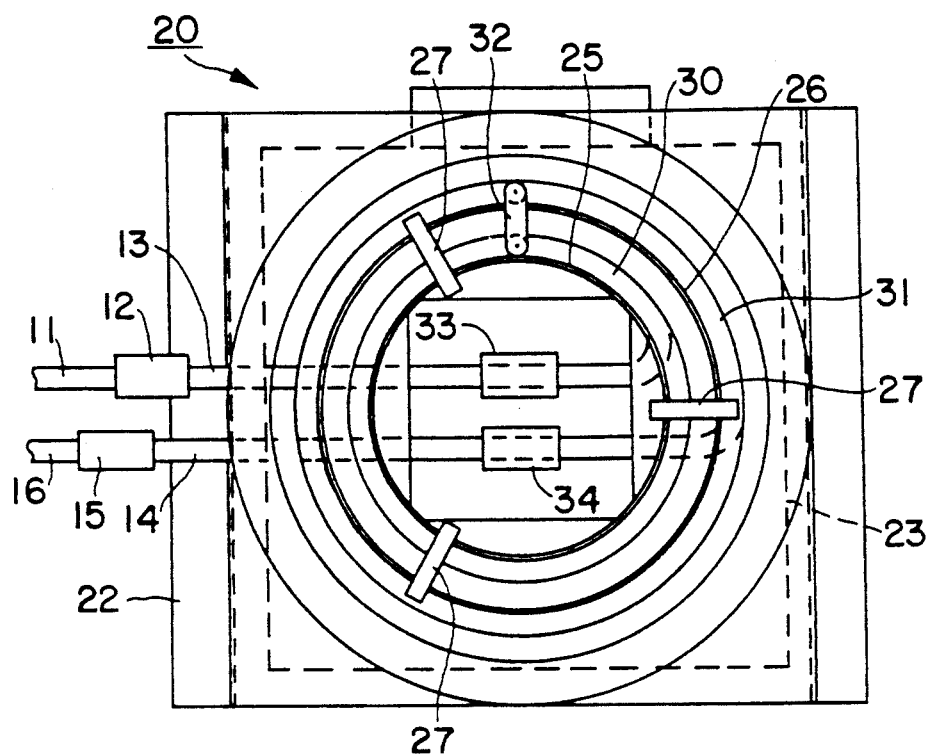
FIG. 4 is a view from line 4—4 in FIG. 3.

The detail of the air cooling device 20 is shown in FIGS. 3 and 4.

In the cooling device 20, a cylindrical outer tube 23 is provided on fan attachment 22 that contains fan 21. The outer tube 23 has an exhaust tube 24 at the top.

A cylindrical inner heat shielding plate 25 and a cylindrical outer heat shielding plate 26 are installed in the outer tube 23. The upper ends of the inner and outer heat shielding plates 25 and 26 are both fastened to connecting plates 27, and these connecting plates 27 are secured to the exhaust tube 24.

Pipes 30 and 31 which are coiled in spiral form are respectively installed on the outside surface of the inner heat shielding plate 25 and the outside surface of the outer heat shielding plate 26, respectively. The upper ends of these pipes 30 and 31 are connected to a transition pipe 32 so that the pipes 30 and 31 communicate with each other via the transition pipe 32. The lower end of the pipe 30 is connected to the intake pipe 13 via a joint 33 (see FIG. 4), while the lower end of the pipe 31 is connected to the outlet pipe 14 via a joint 34.

In this structure, when the vacuum pump 17 is actuated, the air heated by the bonding stage 3 enters the intake pipe 13 of the air cooling device 20 via the pipes 6, 7 and 11. When the air enters the intake pipe 13, the air flows in spiral form in the pipe 30 from the bottom to the top of the inner heat shielding plate 25. The air then flows into the transition pipe 32, proceeds to the pipe 31, and flows in spiral form in the pipe 31 from the top to the bottom of the outer heat shielding plate 26. The air lastly enters the pipe 16 and goes to the vacuum pump 17.

When the heated air is flowing inside the pipes 30 and 31, the air which is inside the outer tube 23 and heated by the pipes 30 and 31 is blown from the bottom to the top in the outer tube 23 by the fan 21 and is discharged to the outside via the exhaust tube 24. Thus, the vacuum air in the outlet pipe 14 enters the pipe 16 after having been cooled to more or less room temperatures by the air cooling device 20, and the thus cooled air enters the vacuum pump 17 through the pipe 16.

Thus, since the vacuum air heated by the bonding stage 3 is cooled by the air cooling device 20 before entering the vacuum pump 17, damage to the vacuum pump 17 is prevented. As the outlet pipe 14 and the pipe 16 which are installed beyond the air cooling device 20 (that is between the air cooling device 20 and the vacuum pump 17), polyurethane tubes, etc. that have ordinary-temperature specifications can be used.

In the present invention, the pipes 30 and 31 are in a spiral form, and the pipe 30 for forward (or upward) movement of air and the pipe 31 for return (or downward) movement of the air are provided in a double layer structure. Also, these forward-path pipe 30 and the return-path pipe 31 are forced to be cooled by the fan 21. Accordingly, it is possible to accomplish more effective air cooling in a small space.

In addition, the inner heat shielding plate 25 and outer heat shielding plate 26 are installed so that the pipes 30 and 31 are tightly provided on the plates without any space between the pipes and plates. Accordingly, the heat from the pipes 30 and 31 is effectively transmitted to the inner and outer heat shielding plates 25 and 26, thus increasing the cooling effect. Such a tight arrangement between the pipes and shielding plates can also prevent the heat of the pipe 30, that is installed on the inner heat shielding plate 25, from being transmitted to the pipe 31, which is installed on the outer heat shielding plate 26.

Figure 5:
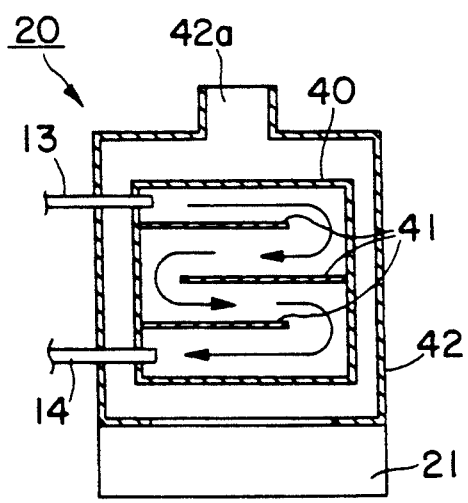
FIG. 5 is a schematic cross section which illustrates another embodiment of the air cooling device used in the present invention.

FIG. 5 shows another embodiment of the air cooling device used in the present invention.

In this embodiment, the intake pipe 13 and the outlet pipe 14 are connected to the upper and lower spaces inside cooling box 40, respectively, of the cooling device 20. A multiple number of partition plates 41 are installed inside the cooling box 40 so that air flows along a meandering path formed by the partition plates 41. Outer box 42 is installed outside the cooling box 40, and an exhaust port 42a is formed at the top of the outer box 42. Fan 21, which cools the outer surface of the cooling box 40, is mounted at the bottom of the outer box 42.

This air cooling device has the same air cooling effect as that obtained by the embodiment shown in FIGS. 1 through 4.

As described above, according to the present invention, the air for vacuum suction that is heated by the bonding stage is cooled by the air cooling device before entering the vacuum pump. Accordingly, damage to the vacuum pump is prevented. In addition, polyurethane tubes, etc. having ordinary-temperature specifications can be used for the pipes installed between the air cooling device and the vacuum pump.

Furthermore, by forming the pipes installed in the air cooling device into a spiral, by using a double piping structure with the forward-path and return-path pipes, and by forcibly cooling these pipes with a fan, it is possible to accomplish effective air cooling in a small space.

In addition, since the heat shielding plates are installed so that the pipes are kept in tight contact with the shielding plates, the heat from the pipes are transmitted to the heat shielding plates, thus increasing the cooling effect.

We claim:
1. A suction adhesion type holder which holds semiconductor workpieces on a bonding stage which is provided with a heating means, by means of vacuum suction adhesion, comprising:
   suction holes provided in said bonding stage;
   a first pipe connected to said suction holes;
   an air cooling device having an input connected to said suction holes via said first pipe;
   a second pipe connected to an output of said air cooling device; and
   a vacuum pump connected to said air cooling device via said second pipe, said vacuum pump providing suction adhesion through said first and second pipes and said cooling device; and
   wherein said air cooling device comprises:
   an outer tube provided with a fan at the bottom;
   an outer heat shielding plate provided said outer tube;
   an inner heat shielding plate provided inside said outer heat shielding plate;
   a forward-path pipe spirally provided on said inner heat shielding plate with one end connected to said first pipe;
   a return-path pipe spirally provided on said outer heat shielding plate with one end connected to said second pipe; and
   a transition pipe that connects the outer end of said forward-path pipe to the other end of said return-path pipe.

* * * * *